United States Patent [19]

Ohkura et al.

[11] Patent Number: 4,780,753
[45] Date of Patent: Oct. 25, 1988

[54] SEMICONDUCTOR INTEGRATED CIRCUIT DEVICE

[75] Inventors: Isao Ohkura, Itami; Shinichi Miyashima, Kamakura; Tatsuya Enomoto, Itami, all of Japan

[73] Assignee: Mitsubishi Denki Kabushiki Kaisha, Tokyo, Japan

[21] Appl. No.: 17,038

[22] Filed: Feb. 18, 1987

Related U.S. Application Data

[63] Continuation of Ser. No. 471,666, Mar. 3, 1983, abandoned.

[30] Foreign Application Priority Data

Mar. 3, 1982 [JP] Japan ............................. 57-34891

[51] Int. Cl.[4] ...................... H01L 27/02; H01L 27/10; H03K 17/687
[52] U.S. Cl. ....................... 357/42; 307/585; 357/45
[58] Field of Search .............. 357/42, 45; 307/576, 307/579, 585

[56] References Cited

U.S. PATENT DOCUMENTS

| | | | |
|---|---|---|---|
| 3,457,435 | 7/1969 | Burns et al. | 307/585 |
| 3,588,635 | 6/1971 | Medwin | 357/42 |
| 4,288,804 | 9/1981 | Kikuchi et al. | 357/42 |
| 4,412,237 | 10/1983 | Matsumura et al. | 357/42 |
| 4,511,814 | 4/1985 | Matsuo et al. | 307/579 |
| 4,513,307 | 4/1985 | Brown | 357/42 |

OTHER PUBLICATIONS

"A 3000-Gate CMOS Masterslice LSI", Proceedings of the 11th Conference on Solid State Devices, Tokyo, 1979.

*Primary Examiner*—Gene M. Munson
*Attorney, Agent, or Firm*—Oblon, Fisher, Spivak, McClelland, & Maier

[57] ABSTRACT

A semiconductor integrated circuit device with a complementary type internal logic function element used as a master slice type gate array LSI is disclosed having two transmission gates. A plurality of pairs of transistors are utilized with each pair comprising a first conductivity type transistor and a second conductivity type transistor. A first transmission gate is constructed with the first conductivity type transistor of one pair of transistors out of two pairs of these transistor pairs and the second conductivity type transistor of the other pair. Second transmission gate is constructed with the first conductivity type transistor of the other transistor pair and the second conductivity type transistor of the first transistor pair so that an area required for constructing the two transmission gates is reduced in order to increase the degree of integration.

1 Claim, 6 Drawing Sheets

SEMICONDUCTOR INTEGRATED CIRCUIT DEVICE

This application is a continuation of application Ser. No. 471,666 filed on Mar. 3, 1983, now abandoned.

BACKGROUND OF THE INVENTION

1. Field of the Invention

This invention relates to a semiconductor integrated circuit device having a complementary type internal logic function element and to be used for a master slice type gate array LSI. More particularly, the present invention is concerned with a semiconductor integrated circuit device having two transmission gates.

2. Discussion of Background

Generally, in a MOS (metal oxide semiconductor) circuit, transmission gates are often used as the switching circuit.

FIG. 1 of the accompanying drawing is a transistor circuit diagram where the transmission gates are realized by a complementary MOS circuit (this circuit will hereinafter be abbreviated as "CMOS"). In the drawing, reference numerals 1 and 2 designate respectively a p-channel type MOS transistor and an n-channel type MOS transistor; numerals 3 and 4 refer to an input terminal and an output terminal, respectively; and reference letters $\overline{C}$ and C designate gate inputs for the p-channel type MOS transistor 1 and the n-channel type MOS transistor 2, respectively, having mutually inverted signals.

The transmission gate of the above-described construction operates in the following manner: in a state where the signal C is maintained at a ground potential and the signal $\overline{C}$ is maintained at a VDD potential, both p-channel type MOS transistor 1 and the n-channel type MOS transistor 2 assume an "off" condition and a region between the source and the drain is electrically shut off, while, in a state where the signal C is maintained at a VDD potential and the signal $\overline{C}$ is maintained at a ground potential, both p-channel type MOS transistor 1 and n-channel type MOS transistor 2 assume an "on" condition and a region between the source and the drain is electrically connected, whereby the transmission gate is in a conductive state.

As one example of using this transmission gate, there is a D-latch as shown in FIG. 2 of the acompanying drawing. In the drawing, reference numerals I and II designate respectively the transmission gates as shown in FIG. 1 above, which are constructed with the MOS transistors 1 and 2. The transmission gate I is to the input side, while the transmission gate II is to the feeback side. III and IV are respectively an input side inverter and a feedback side inverter, each being realized by the CMOS circuit constructed with a pair of the p-channel type MOS transistor 5a and the n-channel type MOS transistor 5b; numerals 6 and 7 are respectively a positive electrode (VDD) terminal and a negative electrode (GND) terminal; and T and $\overline{T}$ are respectively clock inputs having mutually inverted signals. D and Q designate respectively an input signal terminal and an output signal terminal.

In the D-latch of the above-described construction, the two transmission gates I and II operate in mutually opposite modes, i.e., when the one is in a conductive state, the other is always shut off, so that there is no possibility of both gates being in a conductive state or in a shut-off state simultaneously. If it is now assumed that the clock input T is maintained at the VDD potential, and the clock input $\overline{T}$ at the GND potential, the transmission gate I at the input side becomes conductive, a value of the input signal D is taken thereinto, and a signal corresponding to the input signal D appears at the output terminal Q through the input side of inverter III. Next, when the clock input $\overline{T}$ changes to the VDD potential, while the clock input T to the GND potential, the transmission gate II at the feedback side becomes conductive and maintains the output Q at a value corresponding to the value of the input D immediately before the clock inputs T and $\overline{T}$ change by means of the inverter IV and through the inverter III.

In the following, explanations will be made of a manner, in which the D-latch of the abovementioned circuit construction has so far been formed on a substrate. First of all, a master chip of a condition, in which the working steps common to those in the manufacturing steps of the master slice type LSI have been completed (a condition wherein no aluminum wiring has yet been applied) as shown in FIG. 3 of the accompanying drawing, is fabricated. In FIG. 3, a reference numeral 101 designates a region formed on a p-type semiconductor substrate 100 (to be also the substrate for the n-channel type MOS transistor), in which an n-type impurity has been diffused and which is to be the substrate for the p-channel type MOS transistor. Numerals 201 to 211 refer to p+ diffusion regions formed in this n-well region 101, which are the active regions to be the source or drain region for the p-channel type MOS transistor. 301 to 311 represent n+ diffusion regions formed in the abovementioned p-type semiconductor substrate 100, which are the active regions to be the source or drain for the n-channel type MOS transistor and arranged in correspondence to the abovementioned p+ diffusion regions 201 to 211 respectively. Numerals 401 to 410 refer to gates for the p-channel type MOS transistor made of poly-crystalline silicon and which are formed between the adjacent p+ diffusion regions 201 to 211 through an insulating film. Reference numerals 501 to 510 represent gates for the n-channel type MOS transistor made of poly-crystalline silicon and which are formed between the adjacent n+ diffusion regions 301 to 311 through an insulating film and are disposed in correspondence to the abovementioned gates 401 to 410 for the p-channel type MOS transistors, respectively.

Then, on this master chip as shown in FIGS. 3 wherein the basic transistor pair consisting of a pair of the p-channel type MOS transistor and the n-channel type MOS transistor are arranged in the form of an array, there is formed the first aluminum layer having a predetermined pattern through an inter-layer insulating film, and further formed thereover the second aluminum layer having a predetermined pattern through an inter-layer insulating film. From this structure, a construction as shown in FIG. 4 is obtained by effecting electrical connection through a window opened in the inter-layer insulating film between the master chip and the first aluminum layer (this window will hereinafter be called "contact hole") and a window opened in the inter-layer insulating film between the first aluminum layer and the second aluminum layer (this window will hereinafter be called "through-hole") so as to make the circuit construction as shown in FIG. 2.

Incidentally, in FIG. 4, the transmission gate 1 at the input side is constructed with a portion held between A—A' and B—B', i.e., the p-channel type MOS transistor 1 having the gate 406 and the p+ diffusion regions 206, 207, and the n-channel type MOS transistor 2 having the gate 505 and the n+ diffusion regions 305, 306; the transmission gate II at the feedback side is constructed with a portion held between A—A' and C—C', i.e., the p-channel type MOS transistor 1 having the gate 402 and the p+ diffusion regions 202, 203, and the n-channel type MOS transistor 2 having the gate 503 and the n+ diffusion regions 303, 304; the inverter III at the input side is constructed with a portion held between B—B' and D—D', i.e., the gate 408 and the p-channel type MOS transistor 5a having the p+ diffusion regions 208, 209 and the n-channel type MOS transistor 5b having the n+ diffusion regions 308, 309; and the inverter IV at the feedback side is constructed with a portion held between D—D' and E—E', i.e., the p-channel type MOS transistor 5a having the gate 409 and the p+ diffusion regions 209, 210 and the n-channel type MOS transistor 5b having the gate 509 and the n+ diffusion regions 309, 310.

More detailed explanations will be given in the following as to the structure of the D-latch shown in FIG. 4 in further reference to FIGS. 5 and 6. In the drawing, a reference numeral 601 designates a field insulating film formed on the substrate; 602 refers to an inter-layer insulating film formed on the p+ diffusion regions 201 to 211, n+ diffusion regions 301 to 311, the gates 401 to 410, 501 to 510, and the field insulating film 601; and 701 to 711 represent the first aluminum layers (those portions shaded with hatch lines as in FIG. 4) which are formed on the basis of a predetermined pattern formed on this inter-layer insulating film 602. Here, the first aluminum layers 701, 702 respectively serve as the VDD lines for supplying a VDD potential and a GND line for supplying a GND potential, wherein the gates 401, 404, 407 and 410 are connected with the VDD line 701 through the contact hole 901 and the gates 501, 504, 507, and 510 are connected with the GND line 702 also through the contact hole 901 to electrically separate the adjacent logic function elements. At the same time, the p+ diffusion region 209 (to be the source region) to construct the p-channel type MOS transistor 5a of the inverters III and IV is connected with the VDD line 701 through the contact hole 901 to which the VDD potential is supplied, while the n+ diffusion regions 309 (to be the source region) for constructing the n-channel type MOS transistor 5b of the inverters III and IV is connected with the GND line 702 through the contact hole 901, to which the GND potential is supplied. The first aluminum layers 703, 704 constitute input lines to be connected respectively with the p+ diffusion region 207 (to be the source region) for constructing the p-channel type MOS transistor 1 of the transmission gate I at the input side through the contact hole 901, and with the n+ diffusion region 305 (to be the source region) for constructing the n-channel type MOS transistor of the transmission gate I at the input side also through the contact hole 901. The first aluminum layer 705 constitutes an output line to be connected with the p+ diffusion region 208 (to be the drain region) for constructing the p-channel type MOS transistor 5a of the inverter III at the input side and the n+ diffusion region 308 (to be the drain region) for constructing the n-channel type MOS transistor 5b, and with the gate 409 for constructing the p-channel type MOS transistor 5a and the gate 509 for constructing the n-channel type MOS transistor 5b of the inverter IV at the feedback side through the respective contact holes 901. The first aluminum layer 706, 707 are clock lines to connect the gate 406 for constructing the p-channel type MOS transistor 1 of the transmission gate I at the input side with the gate 506 corresponding thereto through the contact hole 901 as well as the gate 505 for constructing the n-channel type MOS transistor 2 of the transmission gate I at the input side with the gate 405 corresponding thereto also through the contact hole 901. The first aluminum layers 708, 709 are also the clock lines which connect the gate 402 for constructing the p-channel type MOS transistor 1 of the transmission gate II at the feedback side with the gate 502 corresponding thereto through the contact hole 901 as well as the gate 503 for constructing the n-channel type MOS transistor 2 of the transmission gate II at the feedback side with the gate 403 also through the contact hole 901. The first aluminum layer 710 is a line for wiring, which connects the p+ diffusion region 206 (to be the drain region) for constructing the p-channel type MOS transistor 1 of the transmission gate I at the input side with the n+ diffusion region 306 (to be the drain region) for constructing the n-channel type MOS transistor 2 of the same, the p+ diffusion region 203 (to be the drain region) for constructing the p-channel type MOS transistor 1 of the transmission gate II at the feedback side wtih the n+ diffusion region 303 constructing the n-channel type MOS transistor 2 of the same, and the gate 408 for constructing the p-channel type MOS transistor 5a of the inverter III at the input side with the gate 508 for constructing the n-channel type MOS transistor 5b of the same, through their respective contact holes 901. The first aluminum layer 711 is a line for wiring, which connects the p+ diffusion region 202 (to be the source region) for constructing the p-channel type MOS transistor 1 of the transmission gate II at the feedback side with the n+ diffusion region 304 (to be the source region) for constructing the n-channel type MOS transistor 2 of the same, and the p+ diffusion region 210 (to be the drain region) for constructing the p-channel type MOS transistor 5a of the inverter IV at the feedback side with the n+ diffusion region 310 (to be the drain region) for constructing the n-channel type MOS transistor 5b of the same, through the respective contact holes 901. A numeral 603 designates an inter-layer insulating film formed on these first aluminum layers 701 to 711 and the inter-layer insulating film 602, and numerals 801 to 806 refer to the second aluminum layers (portions in FIG. 4 where shaded with hatch lines in criss-cross form) which are formed on the basis of a predetermined pattern formed on this inter-layer insulating film 603. Here, the second aluminum layer 801 denotes a D-input signal line which is connected with the first aluminum layers 703, 704 through the through-holes 902. The second aluminum layers 802, 803 constitute T-input signal lines which are connected with the first aluminum layers 707, 708, respectively, through the through-holes 902. The second aluminum layers 804, 805 constitute $\overline{T}$ input signal lines which are connected with the first aluminum layers 706, 709, respectively, through the through-holes 902. The second aluminum layer 806 constitutes a Q-output signal line and is connected with the first aluminum layer 705 through the through-holes 902. A numeral 604 refers to a protective film for protecting the surface of the semiconductor. Incidentally, the n-well region 101 is always fixed at the VDD potential or a potential higher than the VDD potential, while the p-type semiconductor substrate 100 is always fixed at the GND potential or a potential lower than the GND potential.

In such construction, however, as will be apparent from FIG. 4, there are formed the p+ diffusion regions 204, 205 and the n+ diffusion regions 302, 307 which are not used in constructing the circuit in the two transmission gates I and II which operate in the mutually opposite modes with the consequent problem in increasing the degree of integration.

SUMMARY OF THE INVENTION

Accordingly, it is an object of the present invention to provide an improved semiconductor integrated circuit device of a construction, wherein a plurality of pairs of transistors are provided, each pair comprising a first conductivity type transistor and a second conductivity type transistor; the first transmission gate is constructed with the first conductivity type transistor of one pair of transistors out of two pairs of these transistor pairs and the second conductivity type transistor of the other pair; and the second transmission gate is constructed with the first conductivity type transistor of the other transistor pair and the second conductivity type transistor of the one transistor pair, so that an area required for constructing the two transmission gates is reduced to increase the degree of integration.

According to the present invention, in general aspect of it, there is provided a semiconductor integrated circuit device which comprises, in combination: first conductivity type semiconductor substrate; second conductivity type semiconductor region formed in one part of said first conductivity type semiconductor substrate; first conductivity type active regions formed in said second conductivity type semiconductor region in a plurality of rows; a plurality of first gates which are arranged and formed between the adjacent first conductivity type active regions through an insulating film, and construct the first conductivity type transistors along with the first conductivity type active regions to be flanked on both sides of each first gate; a plurality of second conductivity type active regions formed on said semiconductor substrate in correspondence to said first conductivity type active regions; and a plurality of second gates which are formed between adjacent second conductivity type active regions and in correspondence to said first gates, and construct the second conductivity type transistors in pair of said first conductivity type transistors along with the second conductivity type active regions to be flanked on both sides of each second gate, in which device the first transmission gates are constructed with the first conductivity type transistor of one pair of the transistors out of two pairs of the first and second conductivity type transistor pairs and the second conductivity type transistor of the other pair of transistors, where the active regions in the respective transistors are mutually connected and inputs of mutually opposite modes are supplied to the respective gates thereof, and the second transmission gates are constructed with the first conductivity type transistor of the other transistor pair and the second conductivity type transistor of the one transistor pair, where the active regions of the respective transistors are mutually connected and inputs of mutually opposite mode are supplied to the respective gates thereof.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 4:
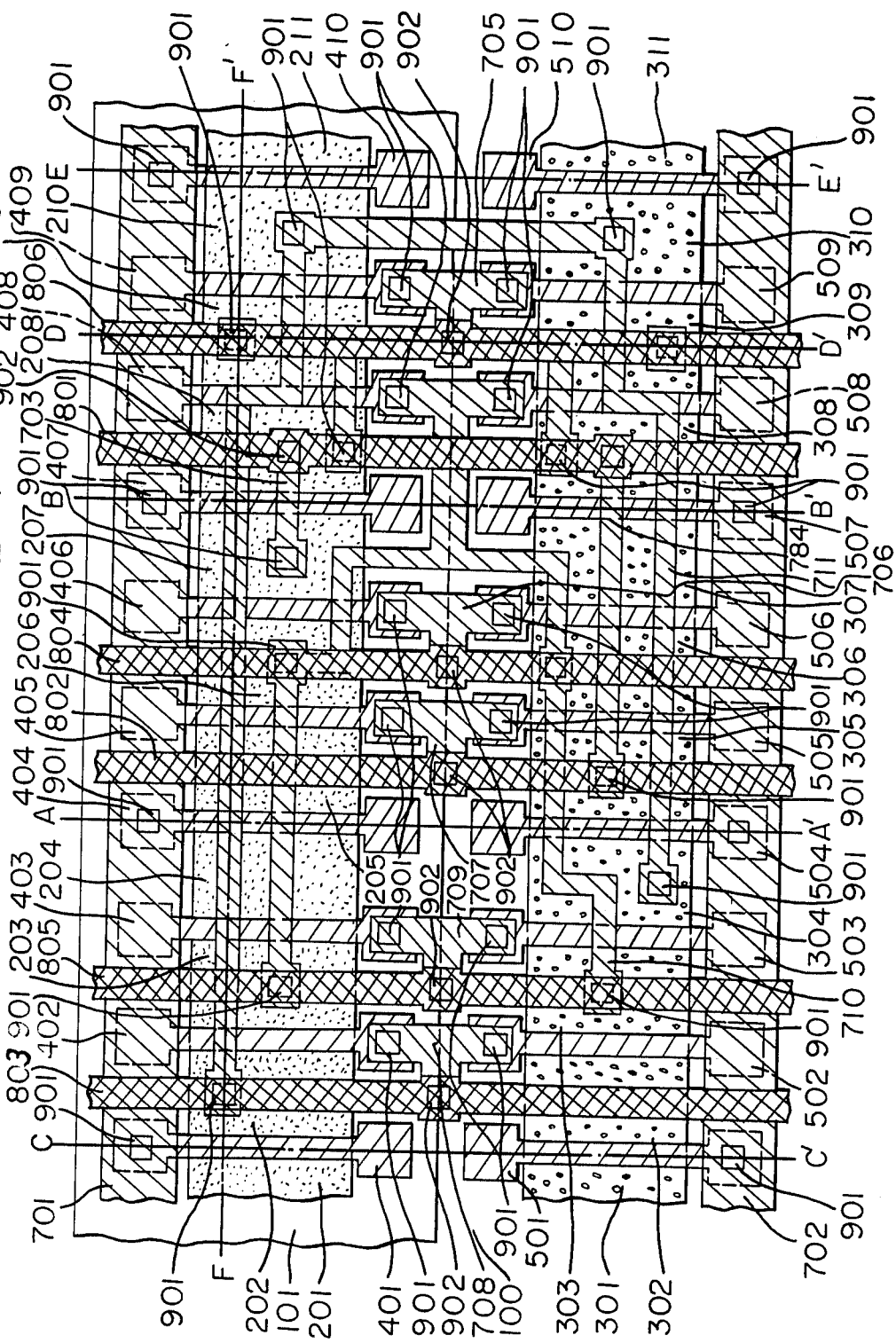
FIG. 4 is a diagram showing one example, in which the circuit in FIG. 2 has been realized on the master in FIG. 3 by the conventional method of construction.
Figure 5:
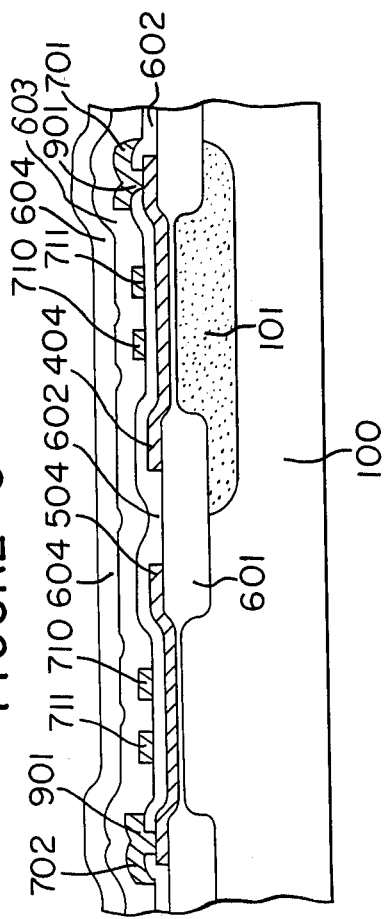
FIGS. 5 and 6 are respectively cross-sectional views taken along the lines A—A' and F—F' in FIG. 4.
Figure 6:
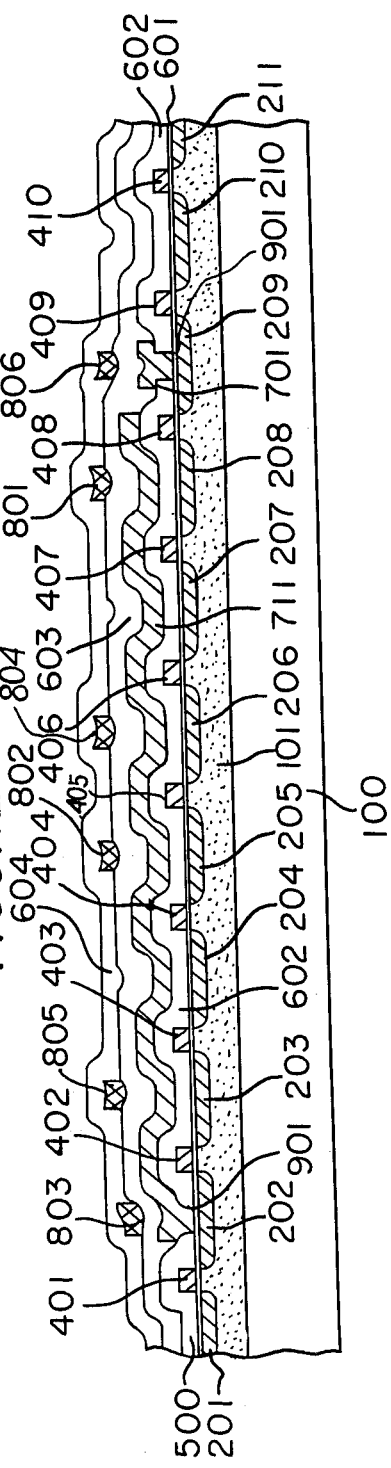
Figure 7:
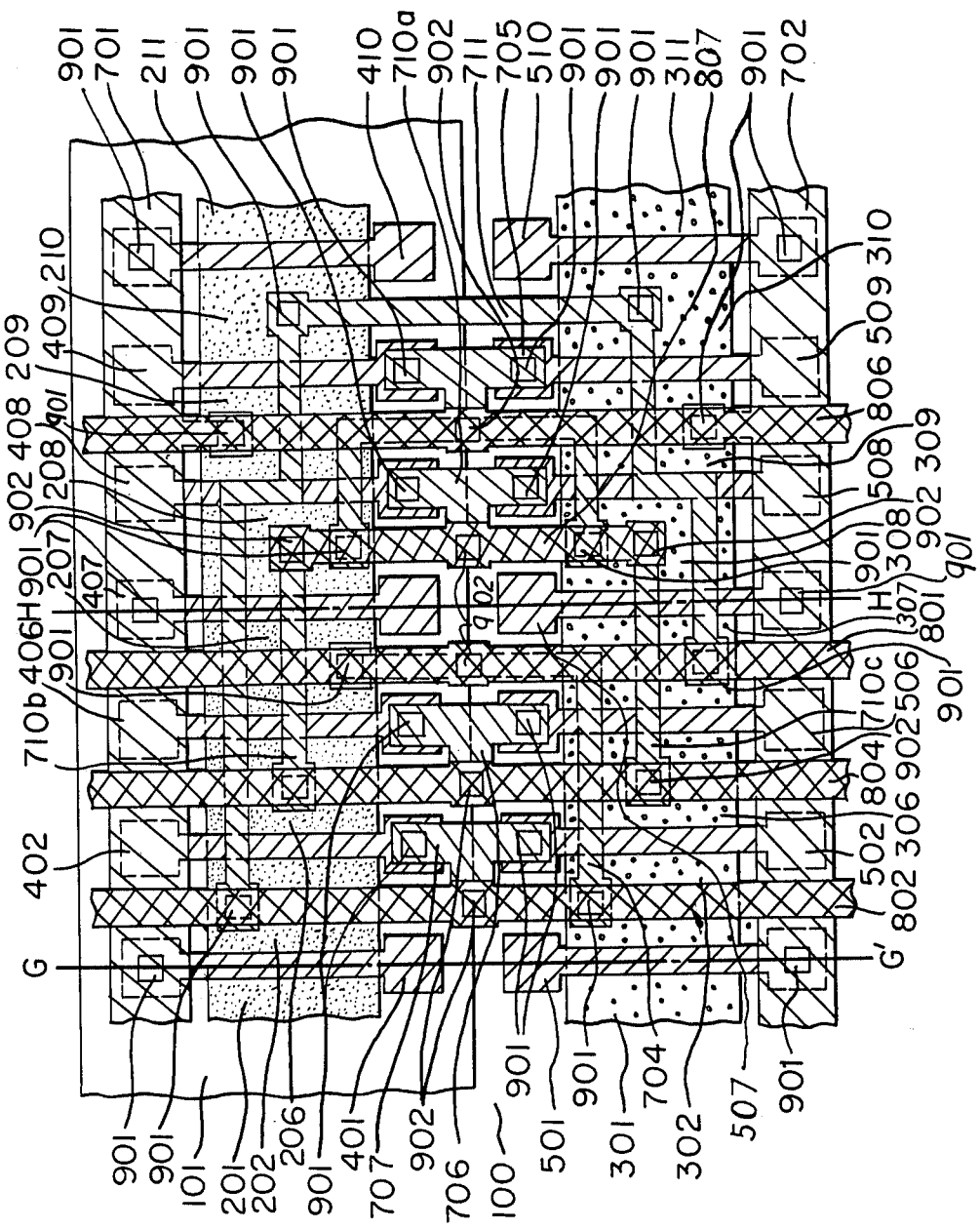
FIG. 7 is a diagram of one embodiment, in which the circuit in FIG. 2 has been realized on the master in FIG. 3 by the method of construction according to the present invention.

Referring now to the drawings, wherein like reference numerals designate identical or corresponding parts throughout the several views, and more particularly to FIG. 7 thereof which shows one embodiment of the present invention. Note should be taken that, in the illustration, the same reference numerals as those in FIG. 4 designate the identical or equivalent parts.

The transmission gates I and II at the input side and the feedback side, respectively, construct those regions held between G—G' and H—H', i.e., they are constructed by use of two pair of transistors, each comprising the p-channel type MOS transistor and n-channel type MOS transistor, wherein a T-input signal line 802 and a $\overline{T}$ input signal line 804 are made common to the two transmission gates.

That is to say, in FIG. 7, the transmission gate I at the input side is constructed with the p-channel type MOS transistor 1 made up of the gate 406, the p+ diffusion region 206 (to be the drain region) and the p+ diffusion region 207 (to be the source region), which are disposed at both sides of the gate, and the n-channel type MOS transistor 2 made up of the gate 502, the n+ diffusion region 302 (to be the source region) and the n+ diffusion region 306 (to be the drain region), which are disposed at both sides of the gate. On the other hand, the transmission gate II at the feedback side is constructed with the p-channel type MOS transistor 1 made up of the gate 402, the p+ diffusion region 202 (to be the source region) and the p+ diffusion region 206 (to be the drain region, and to be also used as the drain region of the p-channel type MOS transistor 1 in the transmission gate I at the input side), which are disposed at both sides of the gate, and the n-channel type MOS transistor 2 made up of the gate 506, the n+ diffusion region 306 (to be the drain region, and to be also used as the drain region of the n-channel type MOS transistor 1 in the transmission gate I at the input side) and the n+ diffusion region 307 (to be the source region), which are disposed at both sides of the gate.

The D-input signal line 801 is connected with the p+ diffusion region 207 to be the source region of the p- channel type MOS transistor 1 of the transmission gate I at the input side and the n+ diffusion region 302 to be the source region of the n-channel type MOS transistor 2 thereof through the first aluminum layer 704; the T-input signal line 802 is connected with the gate 502 of the n-channel type MOS transistor 2 of the transmission gate I at the input side and the gate 402 of the p-channel type MOS transistor 1 of the transmission gate II at the feedback side through the first aluminum layer 707; the T-input signal line 804 is connected with the gate 406 of the p-channel type MOS transistor 1 of the transmission gate I at the input side and the gate 506 of the n-channel type MOD transistor 2 of the transmission gate II at the feedback side through the first aluminum layer 706; the p+ diffusion region 206 and the n+ diffusion region 306 to be the drain regions of the p-channel type MOS transistor 1 and the n-channel type MOS transistor 2 of the transmission gate I and II at the input and the feedback sides, respectively, are connected with the gates 408, 409 of the transistor constituting the inverter III at the input side through the first aluminum layers 710a, 710b, 710c and the second aluminum layer 807; and the p+ diffusion region 202 and the n+ diffusion region 307 to be the source regions of the p-channel type MOS transistor 1 and the n-channel type MOS transistor 2 of the transmission gate II at the feedback side are respectively connected with the p+ diffusion region 210 and the n+ diffusion region 310 to be the drain regions of the transistor constituting the inverter IV at the feedback side through the first aluminum layer 711.

In the above-described manner, since the semiconductor integrated circuit device according to the present invention is so constructed that the input side transmission gate I is made by use of two pairs of transistors, each pair containing the p-channel type MOS transistor and the n-channel type MOS transistor, wherein the p-channel type MOS transistor of the one pair of the transistors and then-channel type MOS transistor of the other pair of transistors are connected together to form the gate, and that the feedback side transmission gate II is constructed with the p-channel type MOS transistor of the other transistor pair and then-channel type MOS transistor of the one transistor pair, there exists no waste portion in the active region, which enables an area required for constructing the device to be reduced. Moreover, since one of the active regions (to be the active region for output) in the p-channel type MOS transistors and the n-channel type MOS transistors constituting the transmission gates at the input and the feedback sides are made common to each other, further reduction in the area required for constructing the device can be effected, thereby making it possible to increase the degree of integration. Furthermore, as the consequence of making common the active region for output in the transistor pairs and of further reduction in area at this portion, an output capacity can be reduced and a propagation delay time can also be reduced effectively.

In the above-described embodiment of the present invention, explanations have been made as to a case wherein the outputs from the two transmission gates take the same signal, when such two transmission gates to be incorporated in the D-latch are constructed. It should, however, be noted that the present invention is not limited to this construction alone, but it can be applied to a circuit construction wherein two different output signals are required for the two transmission gates.

Figure 8:
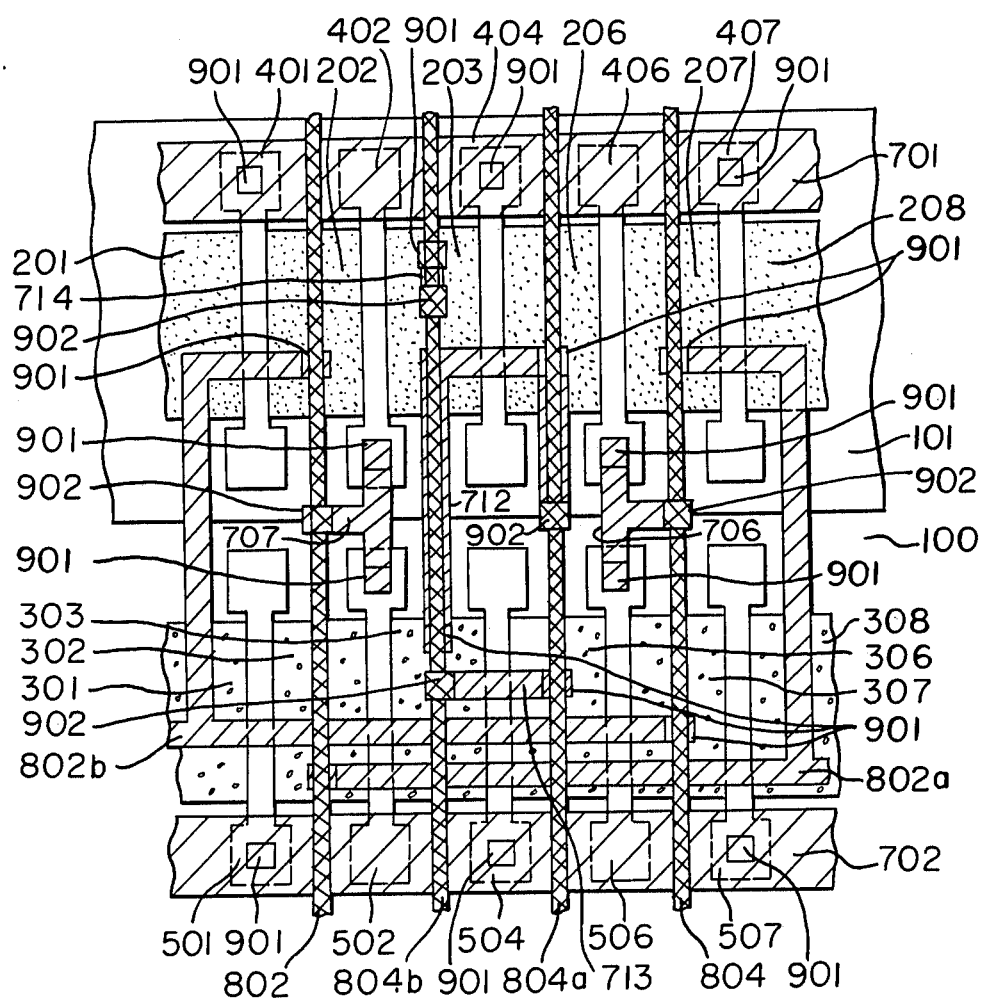
FIG. 8 is a diagram showing another embodiment of the present invention, in which two transmission gates operating in mutually opposite modes and having different output signals have been realized by the method of construction according to the present invention.

FIG. 8 illustrates another embodiment of the present invention wherein the outputs from the two transmission gates take different signals.

Figure 1:
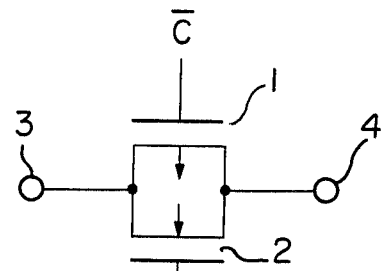
FIG. 1 is a transistor circuit diagram when the transmission gate has been realized with a CMOS circuit.
Figure 2:
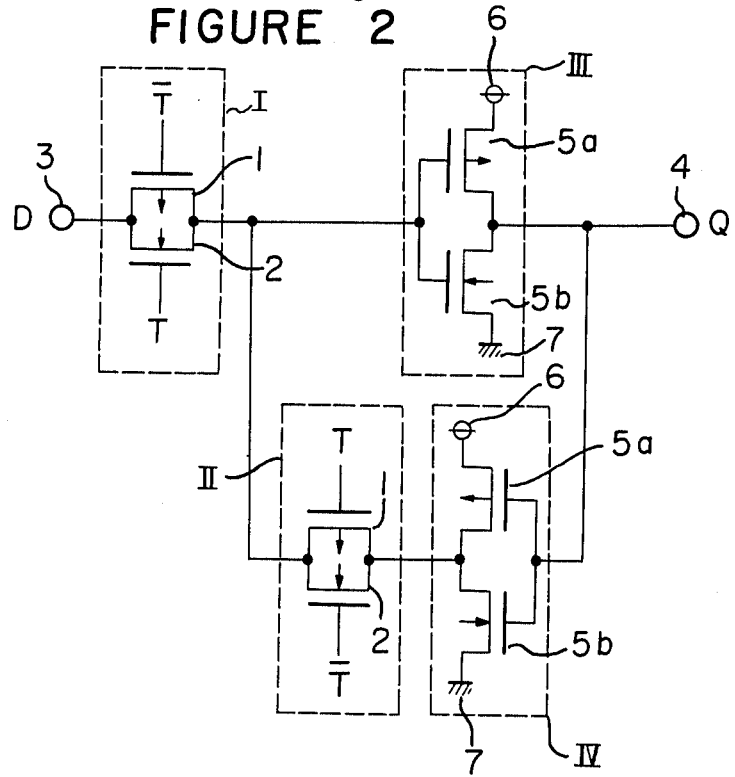
FIG. 2 is a transistor circuit diagram when the D-latch has been realized with the CMOS circuit using the circuit shown in FIG. 1.
Figure 3:
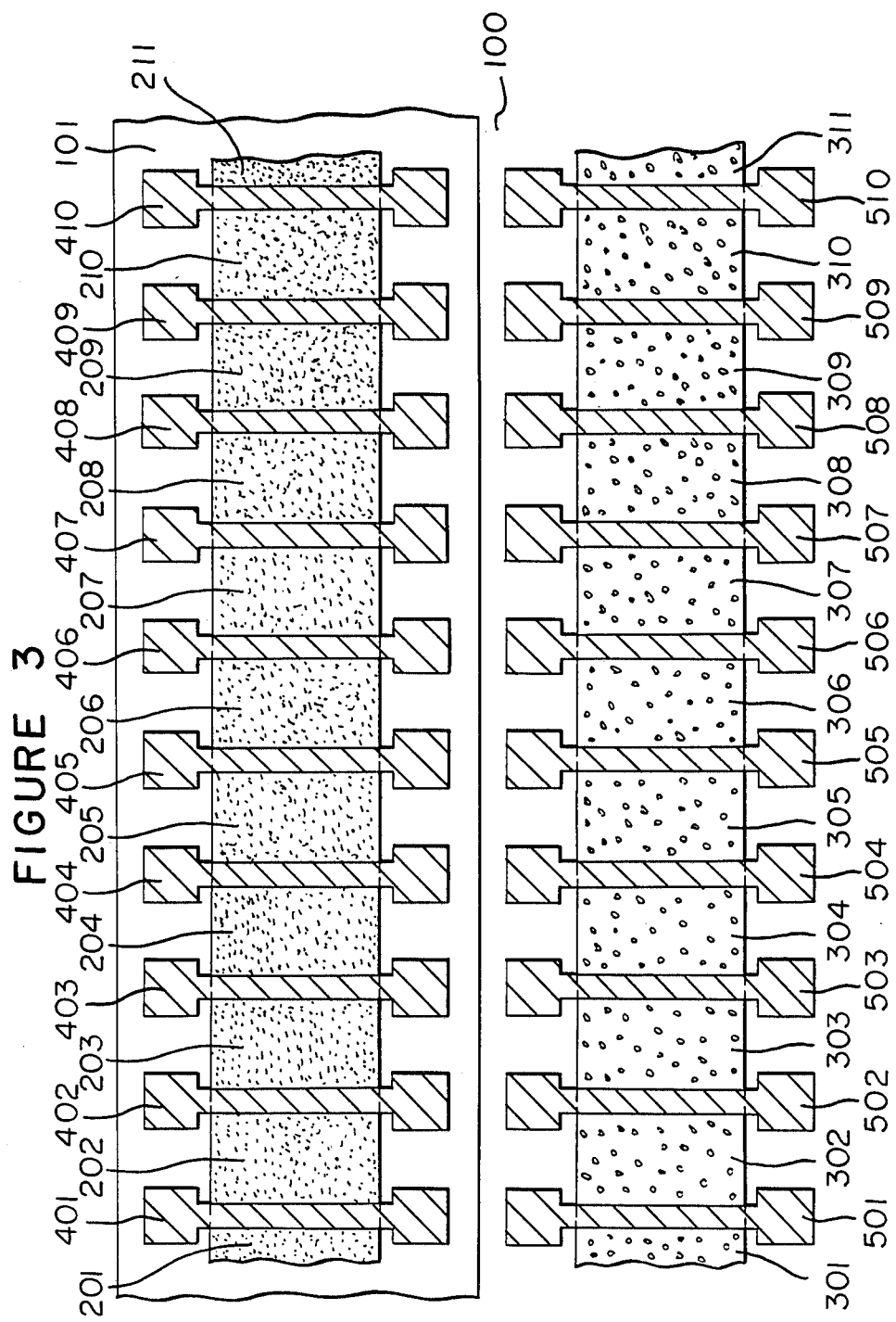
FIG. 3 illustrates one example of the master portion in the inner gate region of the CMOS master slice type gate array LSI.

The embodiment shown in FIG. 8 forms the first and second aluminum layers having a predetermined patterns on the master chip shown in FIG. 3 through the respective inter-layer insulating films, as is the case with the embodiment shown in FIG. 7.

That is to say, in FIG. 8, the first transmission gate is constructed with the p-channel type MOS transistor made up of the gate 406 and the p+ diffusion regions 206, 207 disposed at both sides of the gate, and the n-channel type MOS transistor made up of the gate 502 and the n+ diffusion regions 302, 303; and the second transmission gate is constructed with the p-channel type MOS transistor made up of the gate 402 and the p+ diffusion regions 202, 203 disposed at both sides of the gate, and the n-channel type MOS transistor made up of the gate 506 and the n+ diffusion regions 306, 307 to be disposed at both sides of the gate. Then, a pair of gates 404, 504 are disposed between the p-channel type MOS transistors and between the n-channel type MOS transistors constituting the first and second transmission gates, and a predetermined potential to electrically shut off the adjacent active regions is applied to each of the gates 404, 504. In this embodiment, the gate 404 is connected with the VDD line 701 through the contact hole 901, and the gate 504 is connected with the GND line through the contact hole 901.

Further, the input line 802a of the first transmission gate is formed of the first aluminum layer and is connected with the p+ diffusion region 207 and the n+ diffusion region 302 through the respective contact holes 9a; the input line 802b of the second transmission gate is formed of the first aluminum layer and is connected with the p+ diffusion region 202 and the n+ diffusion region 307 through the respective contact holes 901; the T-input signal line 802 is connected with the gates 402, 502 through the first aluminum layer 707; the T-input signal line 804 is connected with the gate 406, 506 through the first aluminum layer 706; the output line 804a of the first transmission gate is connected with the p+ diffusion region 206 and the n+ diffusion region 303 through the first aluminum layer 712; and the output line 804b of the second transmission gate is connected with the p+ diffusion region 203 and the n+ diffusion region 306 through the first aluminum layers 713, 714.

In such circuit construction, since the first and second transmission gates are capable of electrically shutting off the adjacent active regions by means of the pair of gates, they can produce mutually different output signals. In addition, since the first transmission gate is constructed with the p-channel type MOS transistor of one transistor pair and the n-channel type MOS transistor of the other transistor pair out of two pairs of transistors, each including the p-channel type MOS transistor and the n-channel type MOS transistor, while the second transmission gate is constructed with the p-channel type MOS transistor of the other transistor pair and the n-channel type MOS transistor of the one transistor pair, any waste portion can be eliminated from the active regions, and an area required for the device construction can be reduced, whereby the degree of integration can be increased.

As has been mentioned in the foregoing, the present invention constructs the semiconductor integrated circuit device having two transmission gates which operate in mutually opposite modes in such a manner that a plurality of pairs of transistors are provided, each pair comprising a first conductivity type transistor and a second conductivity type transistor; the first transmission gate is constructed with the first conductivity type transistor of one pair of transistors out of two pairs of these transistor pairs and the second conductivity type transistor of the other pair; and the second transmission gate is constructed with the frist conductivity type transistor of the other transistor pair and the second conductivity type transistor of the one transistor pair, the area required for constructing the two transmission gates can be reduced with the consequence that the degree of integration can be effectively augmented.

In the foregoing, the present invention has been described with reference to preferred embodiments thereof. It should, however, be noted that these embodiments are merely illustrative and not restrictive, and that any changes and modifications may be made by those skilled in the art within the ambit of the present invention as set forth in the appended claims.

We claim:

1. A semiconductor integrated circuit device comprising:
   a first conductivity type semiconductor substrate;
   a second conductivity type semiconductor region formed in one part of said first conductivity type semiconductor substrate;
   a plurality of first conductivity type active regions formed in said second conductivity type semiconductor region in a corresponding plurality of rows;
   a plurality of first gates which are arranged and formed between the adjacent ones of said first conductivity type active regions through an insulating film, and wherein a plurality of first conductivity type transistors are each formed by one of said gates and said first conductivity type active regions flanked on both sides of said each one of said first gates;
   a plurality of second conductivity type active regions formed on said semiconductor substrate in correspondence to said plurality of first conductivity type active regions;
   a first plurality of second gates which are formed between adjacent ones of said second conductivity type active regions and in correspondence to said first gates, wherein a first plurality of second conductivity type transistors are formed by one of said second gates and said second conductivity type active regions flanked on both sides of each one of said second gates wherein a second plurality of said first plurality of second conductivity type transistors are each paired with one of said first conductivity type transistors;
   a plurality of first transmission gates each being constructed with the first conductivity type transistor of one pair of the transistors out of each two pair of said paired transistors of the first and second conductivity type transistor pairs and the second conductivity type transistor of the other pair of transistors, the active regions in the respective transistors being mutually connected and inputs of mutually opposite mode being supplied to the respective gates thereof; and
   a plurality of second transmission gates each being constructed with the first conductivity type transistor of the other transistor pair and second conductivity type transistor of the one transistor pair, the active regions of the respective transistors being mutually connected and inputs of mutually opposite mode being supplied to the respective gates thereof;
   wherein one of the active regions in the first conductivity type transistor constituting said first transmission gate and one of the active regions in the first conductivity type transistor constituting said second transmission gate are constructed with one and the same active region, and one of the active regions in the second conductivity type transistor constituting said first transmission gate and one of the active regions in the second conductivity type transistor constituting said second transmission gate are constructed with one and the same active region.

* * * * *